United States Patent
Zhao

(10) Patent No.: US 10,158,025 B1
(45) Date of Patent: Dec. 18, 2018

(54) TFT DEVICE AND ELECTROSTATIC PROTECTION CIRCUIT OF LIQUID CRYSTAL DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Yang Zhao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/576,858

(22) PCT Filed: Nov. 10, 2017

(86) PCT No.: PCT/CN2017/110312
§ 371 (c)(1),
(2) Date: Nov. 27, 2017

(51) Int. Cl.
*H01L 29/786* (2006.01)
*H01L 27/02* (2006.01)
*H01L 27/12* (2006.01)
*G02F 1/1362* (2006.01)
*G02F 1/1368* (2006.01)

(52) U.S. Cl.
CPC .. *H01L 29/78633* (2013.01); *G02F 1/136204* (2013.01); *H01L 27/0296* (2013.01); *H01L 27/127* (2013.01); *H01L 27/1222* (2013.01); *H01L 27/1225* (2013.01); *H01L 27/1251* (2013.01); *H01L 27/1288* (2013.01); *H01L 29/7869* (2013.01); *H01L 29/78618* (2013.01); *G02F 1/1368* (2013.01); *G02F 2202/10* (2013.01)

(58) Field of Classification Search
None
See application file for complete search history.

(56) References Cited

U.S. PATENT DOCUMENTS

| | | | | |
|---|---|---|---|---|
| 2010/0025676 | A1* | 2/2010 | Yamazaki | H01L 29/78618 257/43 |
| 2015/0243684 | A1* | 8/2015 | Lee | H01L 27/1248 257/43 |
| 2016/0190290 | A1* | 6/2016 | Nomura | H01L 29/66969 257/43 |
| 2016/0190327 | A1* | 6/2016 | Kao | H01L 29/7869 349/43 |

* cited by examiner

*Primary Examiner* — Minh-Loan Tran
(74) *Attorney, Agent, or Firm* — JMB Davis Ben-David

(57) ABSTRACT

A thin film transistor (TFT) device is provided with a glass substrate, a gate metal formed on a surface of the glass substrate; a gate insulating layer formed on the surface of the glass substrate, and covering the gate metal; an indium gallium zinc oxide (IGZO) layer formed on a surface of the gate insulating layer; a source metal and a drain metal formed on a surface of the IGZO layer, and a channel area is formed between the source metal and the drain metal; and a diffraction metal formed on the surface of the IGZO layer and located within the channel area.

16 Claims, 1 Drawing Sheet

TFT DEVICE AND ELECTROSTATIC PROTECTION CIRCUIT OF LIQUID CRYSTAL DISPLAY PANEL

CROSS-REFERENCE TO RELATED APPLICATIONS

This is the U.S. National Stage of International Patent Application No. PCT/CN2017/110312, filed Nov. 10, 2017, which in turn claims the benefit of Chinese Patent Application No. 201710828976.1, filed Sep. 14, 2017.

FIELD OF INVENTION

The present invention relates to a display technology, and more particularly to a TFT (thin film transistor) device and an electrostatic protection circuit of a liquid crystal display panel.

BACKGROUND OF INVENTION

In thin film transistor (TFT) liquid crystal display panels, there is more electrostatic damage. Electro-static discharge (ESD) can prevent instantaneously discharged current from flowing into a pixel array of a liquid crystal display panel from damaging TFT devices in the pixels. Even if the current flows into the pixel array, the ESD can also prevent the gate electrode or the source electrode of the TFT device from generating a large voltage. Therefore, before the current flows into the pixel array, a protection circuit is designed by arranging several TFT in series or in parallel. When there is an instantaneous high current, the instantaneous high current will directly flow into the ESD to protect the pixel array.

An indium gallium zinc oxide (IGZO) TFT is referred to apply a metal oxide layer (IGZO) on an active layer of the TFT device so that migration of the channel carriers of the TFT device is significantly increased, thereby increasing response speed of the pixels.

In an IGZO 4 MASK process (IGZO TFT 4 masks process), because the channel of the TFT is larger, a source metal, a drain metal, and the IGZO layer are prepared by the same mask, and then wet-etched three times. While repeated wet etching will cause over-etching defects of the IGZO layer, and thus affect performance of the TFT device.

In summary, in current IGZO TFT fabrication process the IGZO layer will be over-etched after being etched several times, the over-etched IGZO layer will affect the performance of the TFT device and further affect response speed of the pixels of the liquid crystal display panel.

SUMMARY OF INVENTION

The present invention provides a Thin Film Transistor (TFT) device for reducing the over-etched degree of an indium gallium zinc oxide (IGZO) layer after being etched several times in the etching process, so as to protect the completion of the IGZO layer and further to solve the problems existing in the conventional IGZO preparation that the IGZO layer is over-etched after being etched several times.

For solving above problems, the present invention provides solutions as follows:

The present invention provides a TFT device, comprising:
a glass substrate,
a gate metal formed on a surface of the glass substrate;
a gate insulating layer formed on the surface of the glass substrate, and covering the gate metal;
an IGZO layer formed on a surface of the gate insulating layer;
a source metal and a drain metal formed on a surface of the IGZO layer, wherein a channel area is formed between the source metal and the drain metal; and
a diffraction metal formed on the surface of the IGZO layer and located within the channel area;
wherein the diffraction metal is located at a middle position of the channel area.

According to one preferred embodiment of the present invention, the diffraction metal covers at least a part of the surface of the IGZO layer.

According to one preferred embodiment of the present invention, the IGZO layer is rectangular, and the IGZO layer comprises a first dimension parallel to short sides of the IGZO layer, and a second dimension parallel to long sides of the IGZO layer, wherein the diffraction metal covers the IGZO layer in the first dimension.

According to one preferred embodiment of the present invention, the diffraction metal is rectangular, and the diffraction metal comprises long sides and short sides, wherein the long sides are parallel to the first dimension of the IGZO layer.

According to one preferred embodiment of the present invention, the surface of the IGZO layer has at least one of the diffraction metal formed thereon.

According to one preferred embodiment of the present invention, the surface of the IGZO layer has a first diffraction metal and a second diffraction metal arranged at intervals, wherein the first diffraction metal is near the source metal, and the second diffraction metal is near the drain metal, wherein the distance between the first diffraction metal and the source metal is equal to the distance between the second diffraction metal and the drain metal.

According to one preferred embodiment of the present invention, the diffraction metal has a length ranging from 7 µm to 9 µm, and the diffraction metal has a width ranging from 4 µm to 6 µm.

The present invention further provides a TFT device, comprising:
a glass substrate;
a gate metal formed on a surface of the glass substrate;
a gate insulating layer formed on the surface of the glass substrate, and covering the gate metal;
an IGZO layer formed on a surface of the gate insulating layer;
a source metal and a drain metal formed on a surface of the IGZO layer, wherein a channel area is formed between the source metal and the drain metal; and
a diffraction metal formed on the surface of the IGZO layer and located within the channel area.

According to one preferred embodiment of the present invention, the diffraction metal covers at least a part of the surface of the IGZO layer.

According to one preferred embodiment of the present invention, the IGZO layer is rectangular, and the IGZO layer comprises a first dimension parallel to short sides of the IGZO layer, and a second dimension parallel to long sides of the IGZO layer, wherein the diffraction metal covers the IGZO layer in the first dimension.

According to one preferred embodiment of the present invention, the diffraction metal is rectangular, and the diffraction metal comprises long sides and short sides, wherein the long sides are parallel to the first dimension of the IGZO layer.

According to one preferred embodiment of the present invention, the surface of the IGZO layer has at least one of the diffraction metal formed thereon.

According to one preferred embodiment of the present invention, the surface of the IGZO layer has a first diffraction metal and a second diffraction metal arranged at intervals, wherein the first diffraction metal is near the source metal, and the second diffraction metal is near the drain metal, wherein the distance between the first diffraction metal and the source metal is equal to the distance between the second diffraction metal and the drain metal.

According to one preferred embodiment of the present invention, the diffraction metal has a length ranging from 7 μm to 9 μm, and the diffraction metal has a width ranging from 4 μm to 6 μm.

According to the above objects of the present invention, an electrostatic protection circuit of a liquid crystal display panel is provided. The electrostatic protection circuit is disposed at an input end of a pixel driving circuit of the liquid crystal display panel. The electrostatic protection circuit comprises a metal wiring and at least two TFT devices in series or in parallel; wherein each of the TFT devices comprises:

a glass substrate;

a gate metal formed on a surface of the glass substrate;

a gate insulating layer formed on the surface of the glass substrate, and covering the gate metal;

an IGZO layer formed on a surface of the gate insulating layer;

a source metal and a drain metal formed on a surface of the IGZO layer, wherein a channel area is formed between the source metal and the drain metal; and a diffraction metal formed on the surface of the IGZO layer and located within the channel area.

According to one preferred embodiment of the present invention, the diffraction metal covers at least a part of the surface of the IGZO layer.

The beneficial effects of the present invention are as follows: Compared to the current IGZO TFT device, the IGZO TFT device provided by the present invention has a protection layer disposed on the IGZO layer for preventing the IGZO form over-etched during a multiple etching process. The over-etching issues of the IGZO layer which affects the performance of the TFT device and further affects the response speed of the pixels of the liquid crystal display panel in the production process of the current IGZO TFT can be solved.

BRIEF DESCRIPTION OF DRAWINGS

In order to more clearly illustrate the technical solutions in the embodiment or in the present invention, the following drawings, which are intended to be used in the description of the embodiment or of the present invention, will be briefly described. It is understood that the drawings described below are merely some embodiments of the present invention, and it will be possible to those skilled in the art to obtain other drawings according to these drawings without creative efforts.

DETAILED DESCRIPTION OF PREFERRED EMBODIMENTS

Figure 1:
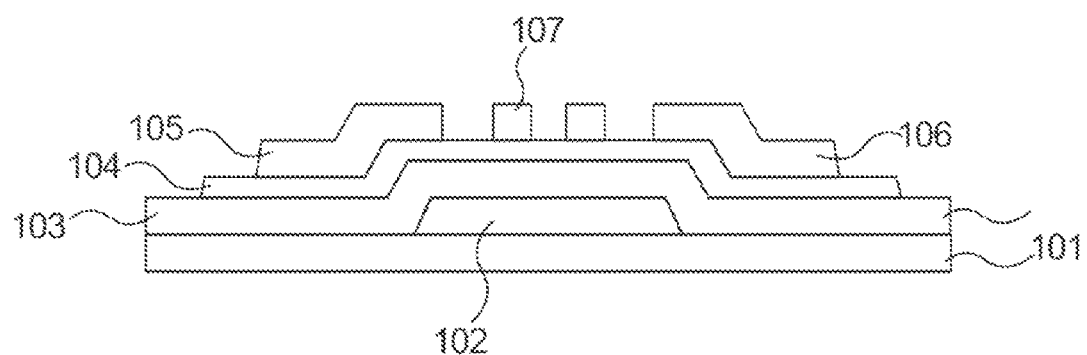
FIG. 1 is a schematic structure of film layers of a TFT (thin film transistor) device according to the present invention.

The description of the following embodiments is used for exemplifying the specific embodiments of the present invention by referring to the accompany drawings. Furthermore, directional terms described by the present invention, such as upper, lower, front, back, left, right, inner, outer, side, etc., are only directions by referring to the accompanying drawings, and thus the directional terms are used to describe and understand the present invention, but the present invention is not limited thereto. In the drawings, like reference numerals designate like elements throughout the specification.

The present invention is directed to over-etching issues of the indium gallium zinc oxide (IGZO) layer which affects performance of thin film transistor (TFT) devices and further affects response speed of pixels of the liquid crystal display panel in production process of current IGZO TFTs. This embodiment can solve the defects.

As shown in FIG. 1, the present invention provides a TFT device, comprising a glass substrate 101; a gate metal 102 formed on a surface of the glass substrate 101; a gate insulating layer 103 formed on the surface of the glass substrate 101, and covering the gate metal 102; an IGZO layer 104 formed on a surface of the gate insulating layer 103; a source metal 105 and a drain metal 106 formed on a surface of the IGZO layer 104, wherein a channel area is formed between the source metal 105 and the drain metal 106; and a diffraction metal 107 formed on the surface of the IGZO layer 104 and located within the channel area.

The source metal 105 and the drain metal 106 are electrically connected with the IGZO layer 104. The IGZO layer 104 is used for realizing electron migration between the source metal 105 and the drain metal 106. The length and the width of the IGZO layer 104 would affect the rate of the electron migration. After the IGZO layer 104 is etched, the surface of the IGZO layer 104 will be damaged, and the IGZO layer 104 is etched from a regular pattern to a special shape so that the width of a part of the IGZO layer 104 is reduced, the electron migration path changes to lower the rate of the electron migration.

In the production process of the IGZO TFT, when the patterns of the source metal 105, the drain metal 106, and the IGZO layer 104 are formed, a photoresist layer is coated on the surface of the IGZO layer 104. After a mask process, the photoresist layer is developed and the photoresist layer on the IGZO LAYER 104 undergoes wet etching for three times. Duo to the material limitation, the IGZO layer 104 is easy to be affected by the wet etching compared to the metal layer. Therefore, when performing an exposure by using the mask, if the amount of light is too small, it will lead to an insufficient exposure depth of the source metal 105 and the drain metal 106. When the amount of light is too large, it will lead to an over exposure of the IGZO layer 104, and cause a damage to the shape IGZO layer 104 during the following wet etching process.

When forming the diffraction metal 107, the diffraction metal 107, the source metal 105, and the drain metal 106 are prepared by the same mask. The mask needs to add a shielding pattern for forming the diffraction metal 107.

When the mask is used for exposure, the exposure area corresponding to the IGZO layer 104 has the diffraction metal 107. When performing exposure, the diffraction metal 107 can achieve the light diffraction to change the light direction from the original irradiation on the photoresist layer of the IGZO to the surrounding, so that the light amount on the photoresist of the IGZO can be reduced.

The diffraction metal 107 is not connected to any potential, it is only applied to achieve the light diffraction during the exposure process.

The diffraction metal 107 covers at least a part of the surface of the IGZO layer 104. For example, the diffraction metal 107 covers ⅕ of the area of the IGZO layer 104. To fulfill the requirement of light diffraction, the oversized coverage of the diffraction metal 107 should be avoided to affect the thickness of the IGZO layer 104

Figure 2:
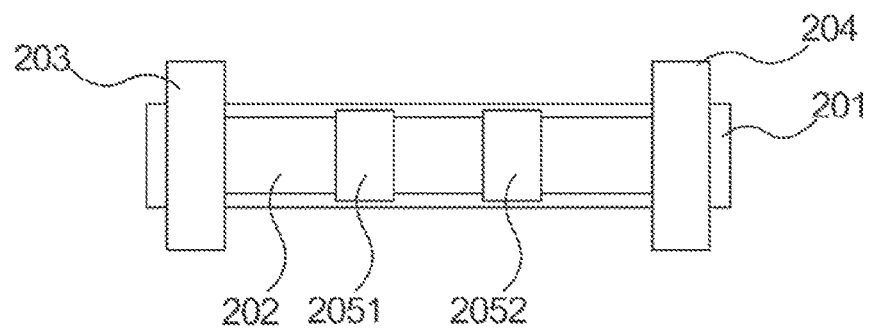
FIG. 2 is a schematic structure of a top view of a TFT device according to the present invention.

As shown in FIG. 2, the present invention provides a TFT device, comprising a glass substrate; a gate metal 201 formed on a surface of the glass substrate; a gate insulating layer formed on the gate metal 201 and the surface of the glass substrate; an IGZO layer 202 formed on a surface of the gate insulating layer; a source metal 203 and a drain metal 204 formed on a surface of the IGZO layer 202, a channel area formed between the source metal 203 and the drain metal 204; and a diffraction metal 205 formed on the surface of the IGZO layer 202 and located within the channel area.

The IGZO layer 202 is rectangular, and the IGZO layer 202 comprises a first dimension parallel to short sides of the IGZO layer 202, and a second dimension parallel to long sides of the IGZO layer 202, wherein the diffraction metal covers the IGZO layer 202 in the first dimension. The source metal 203 is near one end of the IGZO layer 202, and the drain metal 204 is near another relative end of the IGZO layer 202.

The diffraction metal is disposed at a middle position of the channel area, so that the distribution of the diffraction light is even. If the diffraction metal shifts to any side of the channel area, the exposure of the channel area away from the diffraction metal will be increased, and finally the thickness of the IGZO layer 202 will be uneven.

For example, the surface of the IGZO layer 202 has at least one of the diffraction metals. Furthermore, the surface of the IGZO layer 202 has two diffraction metals. On the surface of the IGZO layer 202, there are a first diffraction metal 2051 and a second diffraction metal 2052 arranged at intervals. The first diffraction metal 2051 is near the source metal 203, and the second diffraction metal 2052 is near the drain metal 204, wherein a distance between the first diffraction metal 2051 and the source metal 203 is equal to a distance between the second diffraction metal 2052 and the drain metal 204.

The first diffraction metal 2051 and the second diffraction metal 2052 arranged at intervals can repeat the light diffraction between each other, so as to further reduce the intensity of the light irradiation to protect the IGZO layer 202.

According to above objects of the present invention, a electrostatic protection circuit of a liquid crystal display panel is provided. The electrostatic protection circuit is disposed at an input end of a pixel driving circuit of the liquid crystal display panel. The electrostatic protection circuit comprises a metal wiring and at least two TFT devices in series or in parallel; wherein each of the TFT devices comprises: a glass substrate; a gate metal formed on a surface of the glass substrate; a gate insulating layer formed on the surface of the glass substrate, and covering the gate metal; an IGZO layer formed on a surface of the gate insulating layer; a source metal and a drain metal formed on a surface of the IGZO layer, wherein a channel area is formed between the source metal and the drain metal; and a diffraction metal formed on the surface of the IGZO layer and located within the channel area.

The electrostatic protection circuit in this preferred embodiment has an operation principle the same as that of the TFT device in the abovementioned preferred embodiment. The specific principle can be referred to the operation principle of the TFT device, and does not repeat again.

The beneficial effects of the present invention are as follows: Compared to the current IGZO TFT device, the IGZO TFT device provided by the present invention has a protection layer disposed on the IGZO layer for preventing the IGZO form over-etched during a multiple etching process. The over-etching issues of the IGZO layer which affects the performance of the TFT device and further affects the response speed of the pixels of the liquid crystal display panel in the production process of the current IGZO TFT can be solved.

The present invention has been described with preferred embodiments thereof and it is understood that many changes and modifications to the described embodiments can be carried out by the skilled person in the art without departing from the scope and the spirit of the invention that is intended to be limited only by the appended claims.

What is claimed is:

1. A thin film transistor (TFT) device, comprising:
a glass substrate;
a gate metal formed on a surface of the glass substrate;
a gate insulating layer formed on the surface of the glass substrate, and covering the gate metal;
an indium gallium zinc oxide (IGZO) layer formed on a surface of the gate insulating layer;
a source metal and a drain metal formed on a surface of the IGZO layer, wherein a channel area is formed between the source metal and the drain metal; and
a diffraction metal formed on the surface of the IGZO layer and located within the channel area;
wherein the diffraction metal is located at a middle position of the channel area.

2. The TFT device according to claim 1, wherein the diffraction metal covers at least a part of the surface of the IGZO layer.

3. The TFT device according to claim 2, wherein the IGZO layer is rectangular, and the IGZO layer comprises a first dimension parallel to short sides of the IGZO layer, and a second dimension parallel to long sides of the IGZO layer, wherein the diffraction metal covers the IGZO layer in the first dimension.

4. The TFT device according to claim 3, wherein the diffraction metal is rectangular, and the diffraction metal comprises long sides and short sides, wherein the long sides are parallel to the first dimension of the IGZO layer.

5. The TFT device according to claim 1, wherein the surface of the IGZO layer has at least one of the diffraction metal formed thereon.

6. The TFT device according to claim 5, wherein the surface of the IGZO layer has a first diffraction metal and a second diffraction metal arranged at intervals, wherein the first diffraction metal is near the source metal, and the second diffraction metal is near the drain metal, wherein the distance between the first diffraction metal and the source metal is equal to the distance between the second diffraction metal and the drain metal.

7. The TFT device according to claim 1, wherein the diffraction metal has a length ranging from 7 μm to 9 μm, and the diffraction metal has a width ranging from 4 μm to 6 μm.

8. A thin film transistor (TFT) device, comprising:
a glass substrate;
a gate metal formed on a surface of the glass substrate;
a gate insulating layer formed on the surface of the glass substrate, and covering the gate metal;
an indium gallium zinc oxide (IGZO) layer formed on a surface of the gate insulating layer;
a source metal and a drain metal formed on a surface of the IGZO layer, wherein a channel area is formed between the source metal and the drain metal; and a diffraction metal formed on the surface of the IGZO layer and located within the channel area.

9. The TFT device according to claim 8, wherein the diffraction metal covers at least a part of the surface of the IGZO layer.

10. The TFT device according to claim 9, wherein the IGZO layer is rectangular, and the IGZO layer comprises a first dimension parallel to short sides of the IGZO layer, and a second dimension parallel to long sides of the IGZO layer, wherein the diffraction metal covers the IGZO layer in the first dimension.

11. The TFT device according to claim 10, wherein the diffraction metal is rectangular, and the diffraction metal comprises long sides and short sides, wherein the long sides are parallel to the first dimension of the IGZO layer.

12. The TFT device according to claim 8, wherein the surface of the IGZO layer has at least one of the diffraction metal formed thereon.

13. The TFT device according to claim 12, wherein the surface of the IGZO layer has a first diffraction metal and a second diffraction metal arranged at intervals, wherein the first diffraction metal is near the source metal, and the second diffraction metal is near the drain metal, wherein the distance between the first diffraction metal and the source metal is equal to the distance between the second diffraction metal and the drain metal.

14. The TFT device according to claim 8, wherein the diffraction metal has a length ranging from 7 μm to 9 μm, and the diffraction metal has a width ranging from 4 μm to 6 μm.

15. An electrostatic protection circuit of a liquid crystal display panel, disposed at an input end of a pixel driving circuit of the liquid crystal display panel, wherein the electrostatic protection circuit comprises a metal wiring and at least two thin film transistor (TFT) devices in series or in parallel; wherein each of the TFT devices comprises:

a glass substrate;

a gate metal formed on a surface of the glass substrate;

a gate insulating layer formed on the surface of the glass substrate, and covering the gate metal;

an indium gallium zinc oxide (IGZO) layer formed on a surface of the gate insulating layer;

a source metal and a drain metal formed on a surface of the IGZO layer, wherein a channel area is formed between the source metal and the drain metal; and a diffraction metal formed on the surface of the IGZO layer and located within the channel area.

16. The electrostatic protection circuit according to claim 15, wherein the diffraction metal covers at least a part of the surface of the IGZO layer.

\* \* \* \* \*